Figure 1:
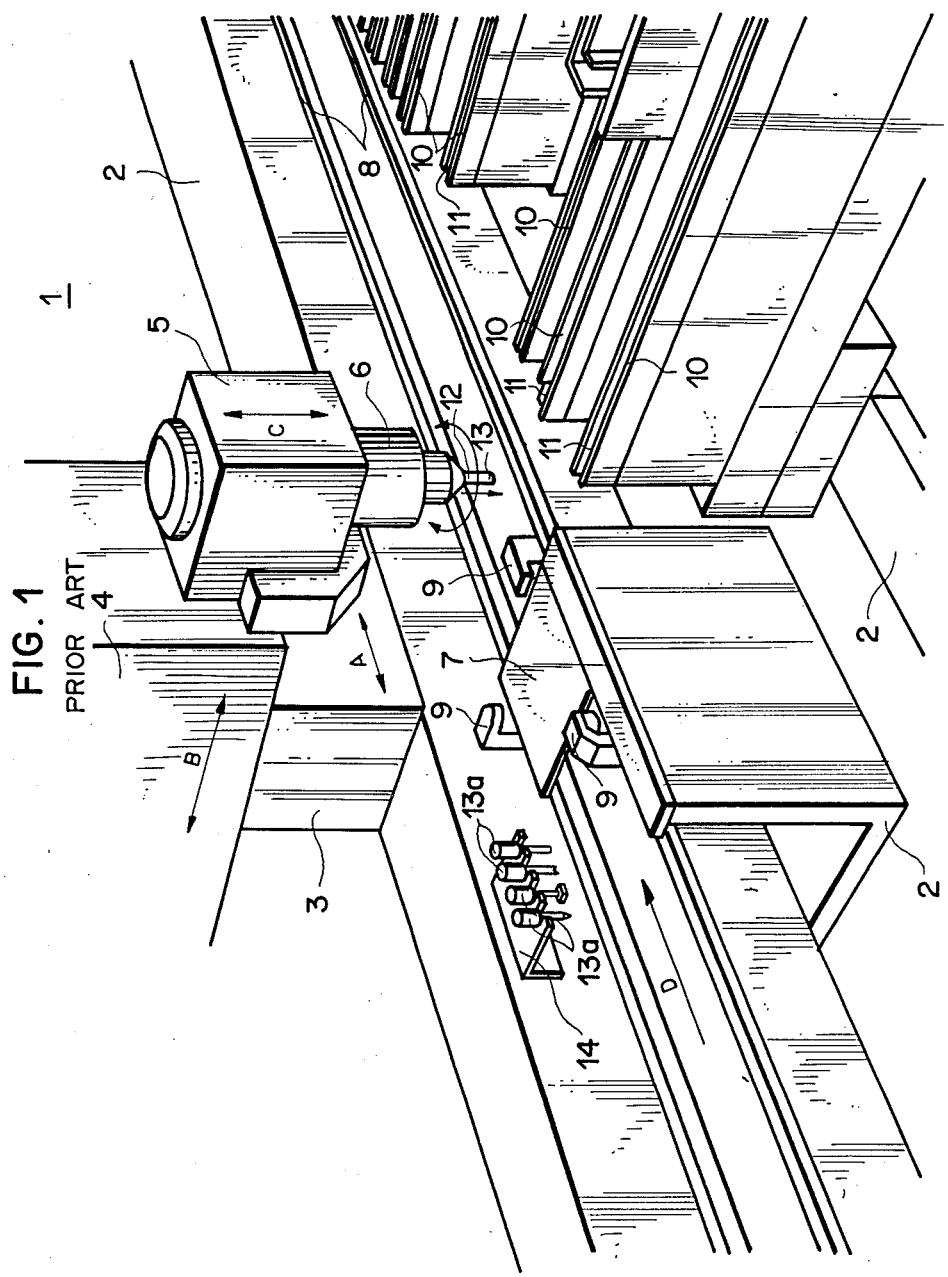

United States Patent [19]

Jeanmairet et al.

[11] Patent Number: 4,787,137
[45] Date of Patent: Nov. 29, 1988

[54] AUTOMATIC COMPONENT PLACER AND PLACER HEAD

[75] Inventors: Maurice Jeanmairet, Boudry; Raymond Stauffer, La Chaux-de-Fonds, both of Switzerland

[73] Assignee: Ismeca, SA, La Chaux-de-Fonds, Switzerland

[21] Appl. No.: 928,238

[22] Filed: Nov. 6, 1986

[30] Foreign Application Priority Data

Nov. 8, 1985 [CH] Switzerland .................. 4811/85

[51] Int. Cl.$^4$ .............................................. H05K 3/30
[52] U.S. Cl. ........................................ 29/740; 29/741; 29/743
[58] Field of Search .............. 29/740, 741, 759, 564.1, 29/743

[56] References Cited

U.S. PATENT DOCUMENTS 4,649,633 3/1987 Bocchicchio et al. ................ 29/739

OTHER PUBLICATIONS

Specification sheet of Isméca Placer Machine published in Mar., 1985.

Primary Examiner—Carl E. Hall
Attorney, Agent, or Firm—Townsend & Townsend

[57] ABSTRACT

In order that lowering of the transfer tube of the head may take place properly, motors and linkages enter into action. A particular arrangement of a pivot of one lever, comprising a notch on the pivot and an aperture in a bearing piece, brings about a compulsory first phase of lowering and a containable end of lowering. The proper adjustments are simpler, annoyances due to inertia are eliminated. An automatic arrangement allows the release force to be regulated. Centering jaws are actuated radially by a similar motor-operated control arrangement. The machine is especially suitable for producing electronic circuits.

22 Claims, 7 Drawing Sheets

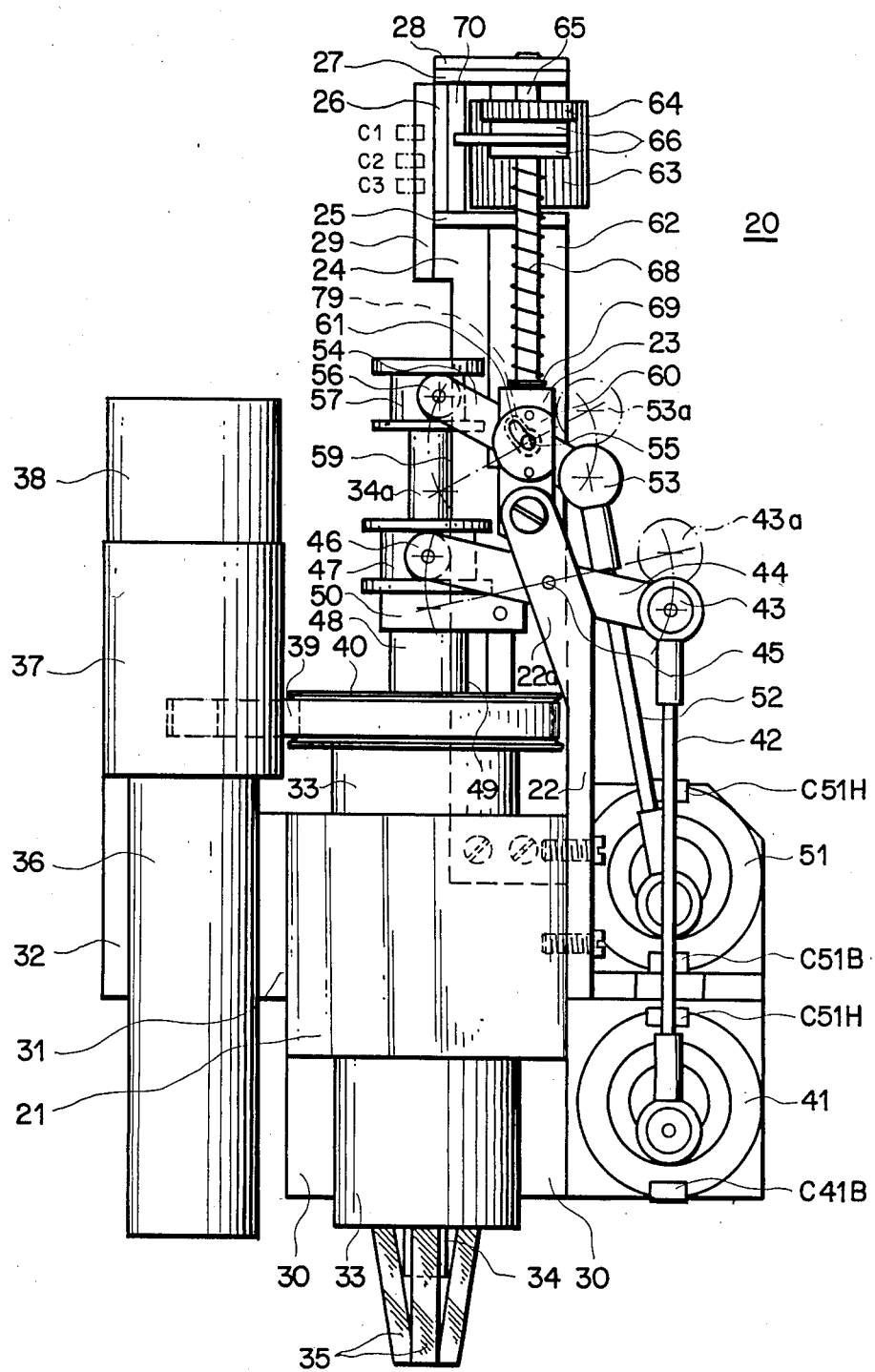

AUTOMATIC COMPONENT PLACER AND PLACER HEAD

This invention relates to automated manufacturing equipment, and more particularly to an automatic machine for placing components on substrates, intended especially for producing electronic circuits, of the type having at least one component feed location, substrate-supporting means, at least one placer head of the type described below, and means for successively positioning the head above the feed locations and the substrate-supporting means.

The invention also relates to a placer head for the aforementioned machine, of the type having a lowerable transfer tube which has a controlled component-pickup tip and which is capable of dipping to withdraw from a feed location a component which may have various shapes and to put it in place on a substrate disposed on the supporting means, and means for controlling such dipping of the transfer tube.

Automatic "pick-and-place" machines of the above type are already available. One such machine is marketed by the present assignee and by its associated company in the United States, Ismeca U.S.A., Inc., of Lancaster, Pa., under the catalogue name of "Ismeca Placer." Other companies offer machines of the same type.

The aforementioned existing machine, which is typical of the prior art, comprises a plurality of feed locations at each of which there may arrive components such as chips, resistors, capacitors, etc., for forming an electronic circuit. These locations are supplied mainly by tapes of tape-packaged components, vibratory sticks, or magazines to be loaded beforehand. Acceptable component sizes range from 1 to 28 mm.

As in virtually all machines of this type, the pickup capability at the tip of the transfer tube is achieved by suction, selectively switched on and off.

In the aforementioned machine, the means for controlling lowering of the transfer tube are pneumatic, forcing a piston from one end position to the other.

The pickup tip of the transfer tube takes the form of an interchangeable nozzle selected from a set of different nozzles accompanying the machine. Centering jaws are provided for increasing the positioning accuracy of the components to be placed on the substrate.

There are, however, various ways in which it would be desirable to improve the performance of the prior art equipment, and it is the general aim of the present invention to provide such improvements.

Even leaving aside the diversity of shapes of the components to be placed, the range of their outside dimensions must be considered. Since the stroke of the transfer tube is fixed, the parameter relating to the thickness (or diameter) of the component is taken into account by the vertical positioning of the head as a whole. With the present system of compulsory lowering, however, a component of rather slight diameter or thickness is liable not to be well placed on the substrate, whereas a rather thick one will be practically crushed between the nozzle of the transfer tube and the substrate. Hence a suitable compromise must be found for the vertical positioning of the head prior to lowering each time (memorized by a computer); this complicates adjustment and makes it necessary to modify the height of the head before it is lowered, even for two cylindrical components differing only a fraction of a millimeter in diameter. Hence adjustment of the machine, for each of the numerous components to be placed on the substrate during a cycle, is rather delicate, and this situation bars use of the machine for a wide range of component sizes.

The solution consisting in controlling the whole dipping stroke elastically cannot be adopted, for it would present the major drawback of an operating accuracy depending upon the rate of speed, owing to the inertia of the moving parts. Thus, a precise adjustment effected at a slow rate is no longer, or hardly any longer, reproducible at a high rate of speed, the nozzle being liable to behave like a power-hammer damaging the component. Moreover, the working times would be lengthened. Because of this inertia effect a completely elastic dipping cannot be envisaged. The problem of the inertia is even bothersome in the present machines with rigidly compulsory dipping, and the invention aims to improve the situation as to this drawback of inertia.

A totally elastic dipping stroke would furthermore also have the notable drawback of making the changes of nozzle, which require an appreciably greater force than the placement of medium-size components, highly uncertain. Moreover, it is noted that the force necessary for putting various components in place may be very variable, ranging from scarcely a few grams for the smallest components up to on the order of 80 g, for example, for large-size chips having numerous clamps to be inserted in a hole or in a lump of conductive adhesive. The completely compulsory dipping stroke of the prior art ignores these questions. A more advanced development can no longer ignore these problems, and an advantageous solution should be found to these questions (due to the fact that the placement encounters different sorts and values of forces).

If it becomes possible to improve the flexibility of use by improving the range of acceptable component sizes, as a result of simplification of the adjustments, the range of operation of the centering jaws, when these are present, ought to broadened in conjunction therewith. Stepped centering jaws, the span of which is determined by the level and hence the shape of the nozzle, may be used only to a small extent. As a matter of fact, the lowering of the transfer tube, with the nozzle, must remain relatively slight (on the order of 20 mm); and if a short nozzle had to pick up a small component then to be recentered by the most central steps of the jaws, the head will already have to be positioned relatively low prior to dipping, and jaws extending too far downward would be liable to obstruct the working space, especially to interfere with the walls of feed magazines. One of the performances aimed at therefore concerns an increase in the capacity of the centering jaws (the present capacity of some 20 mm would be advantageously increased to some 50 mm, or 2").

It is therefore a main object of the invention to provide an improved component placer and head therefor which performs better than prior art machines, particularly as regards elimination of the harmful effects of inertia, simplification of the adjustments without any decrease in accuracy, flexibility of use, and range of the acceptable component sizes and shapes.

To this end, in the automatic machine for placing components on substrates according to the present invention, the means for controlling dipping of the transfer tube comprise driving means provided with a selectively reciprocated element and transmission means for the selectively compulsory and retainable transmission of the reciprocation of the element to the transfer tube, comprising a device for selective determination of "compulsory/retainable" transmission responsive to the reciprocation for defining the dipping in a first phase, of compulsory lowering of the transfer tube, and in a second phase, of elastically conditioned lowering, of the transfer tube, spring means being provided for determining an elastic escapement force for the second dipping phase.

In the placer head according to the invention, the means for controlling dipping of the transfer tube comprise the features set forth above.

Figure 2:
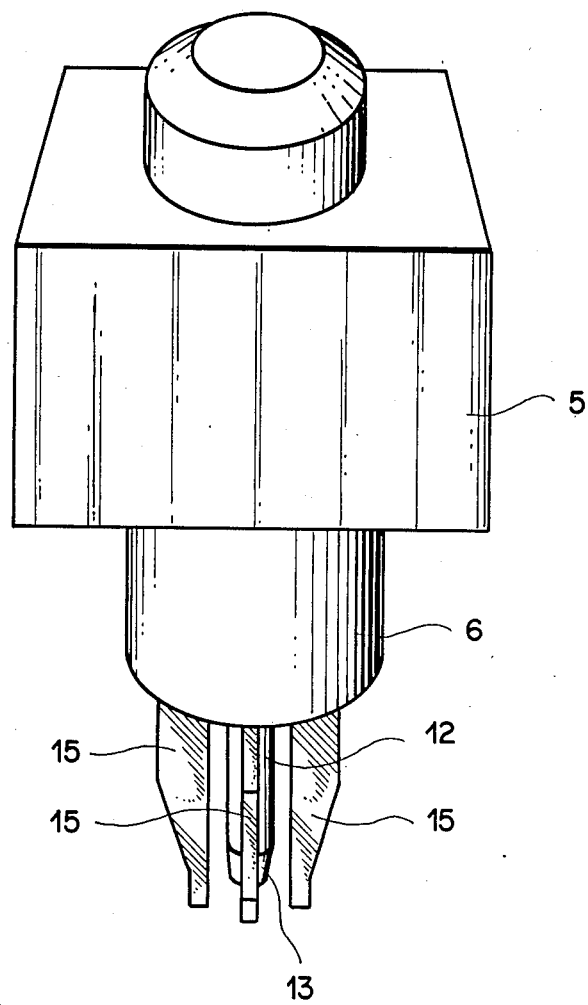
Figure 3B:
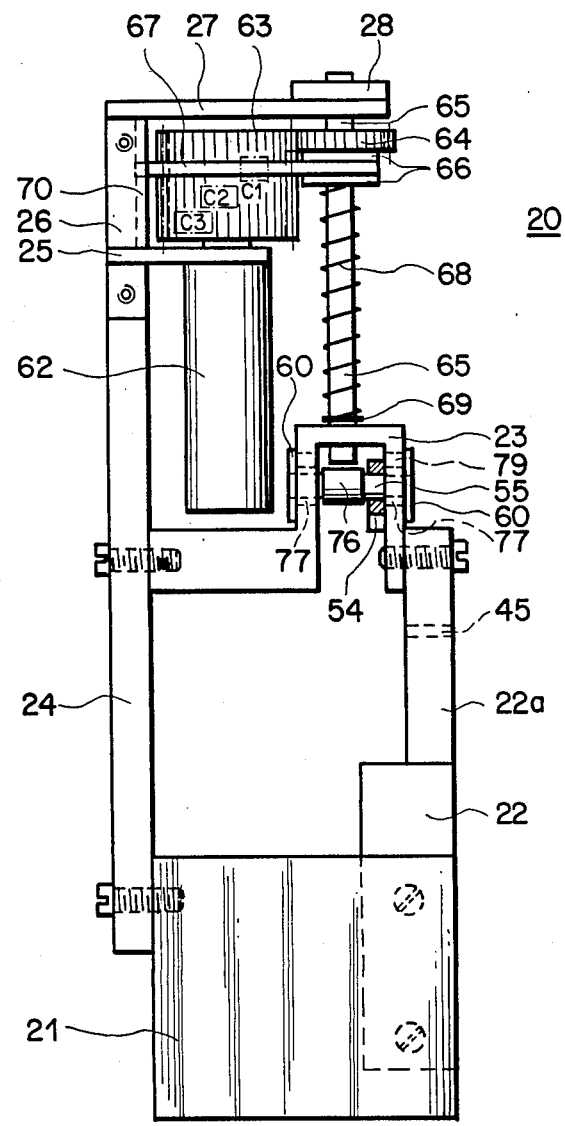
Figure 4A:
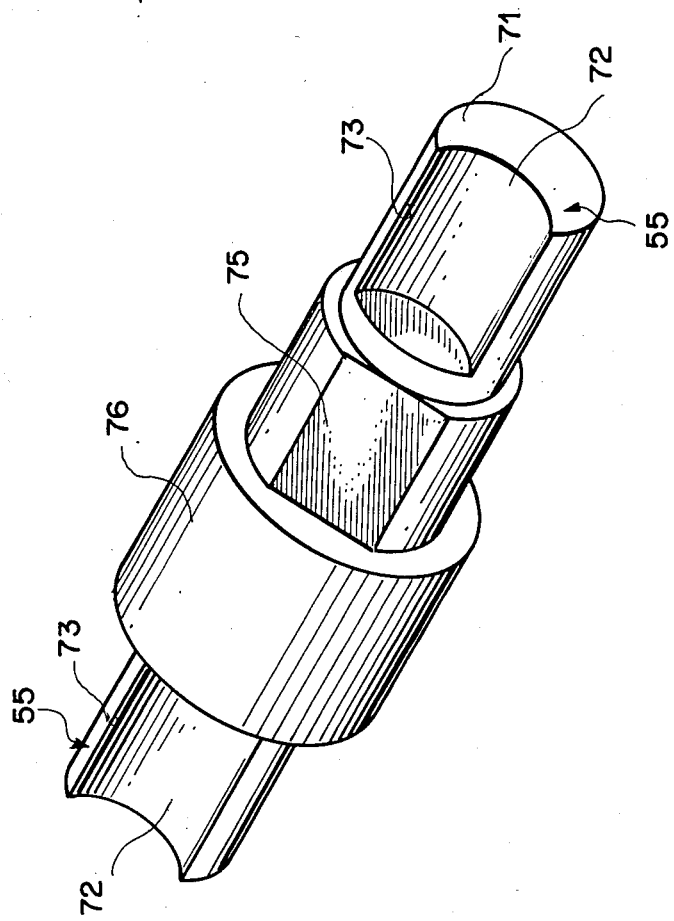
Figure 4B:
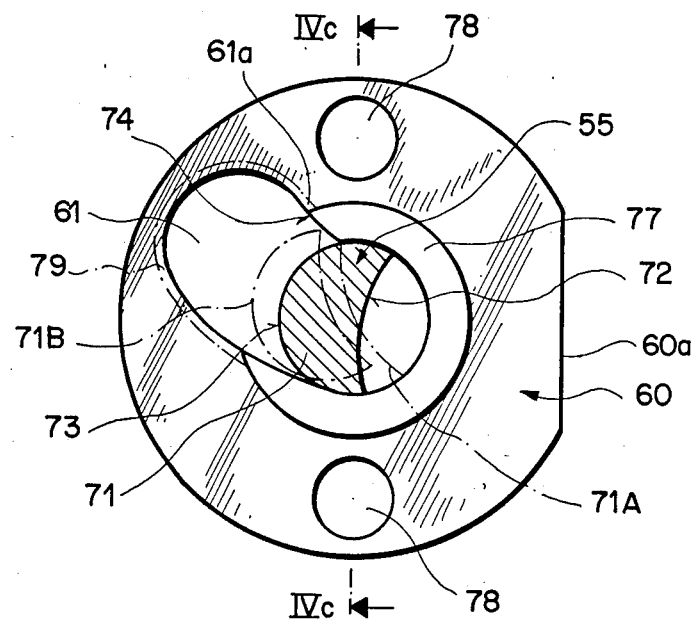
Figure 4C:
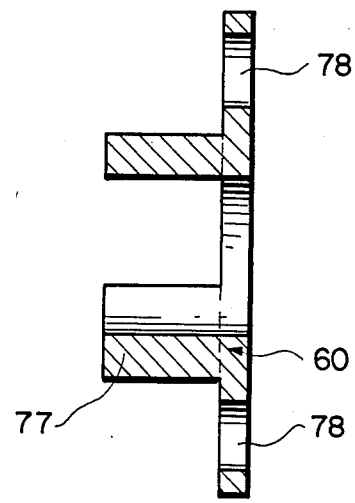
Figure 5:
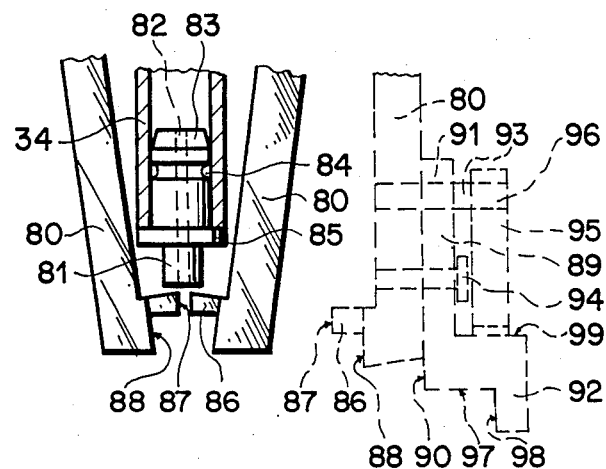
Figure 6:
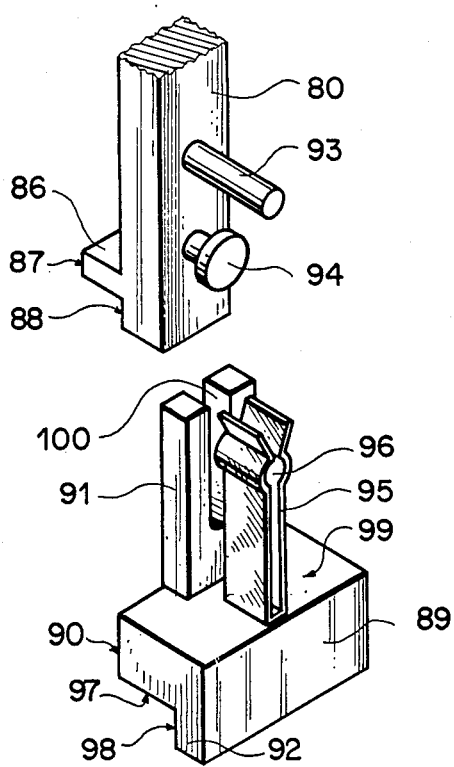

Other objects and advantages of the invention will become apparent from the following detailed description of a preferred embodiment thereof, taken in conjunction with the accompanying drawings, in which:

FIG. 1 is a perspective view of the general design of a prior art automatic placer machine of the type in question, such as may be found, for example, in the Ismeca catalogue mentioned earlier, FIG. 2 is a partial perspective view, also to be found in the aforementioned catalogue, of the tip of a prior art placer head provided with centering jaws, FIGS. 3a and 3b are front and side elevations, respectively, of the placer head in accordance with the inventive design for the machine according to the present invention, FIGS. 4a, 4b and 4c are perspective, end-on, and sectional views, respectively, of a pivoting device for a lever for selecting the compulsory or non-compulsory nature of a kinematic train used in the placer head according to the invention, FIG. 5 is a diagram illustrating the position of the centering jaws fittable with removable extension pieces for extending the centering span, and FIG. 6 is a perspective view showing how the centering-jaw extension pieces are securable to the centering jaws.

FIG. 1 shows the general layout of an automatic placer machine of the "Ismeca Placer" type as currently available on the market, this general layout being the same for the prior art machine and for the machine according to the present invention. This machine 1 comprises, on an assembly of frame parts 2, three-dimensional-positioning blocks 3, 4, and 5 displaceable in the three directions indicated by arrows A, B, and C. Block 5 bears a placer head 6 arranged for placing circuit components on a hybrid-circuit substrate 7. This substrate is disposed on support means consisting of two rails 8 which may be moved together or apart depending on the width of substrate 7. Clamps 9 told substrate 7 firmly as it is brought up on support rails 8 in the direction indicated by arrow D.

Just beside rails 8, machine 1 comprises component feed devices 10. In FIG. 1, devices 10 are shown as being vibratory sticks; however, as is well known to those skilled in the art, and as is the case with the "Ismeca Placer," various types of feed device can operate parallel to one another, the type most frequently used being tapes of components, whereas magazines are also used, mainly for large-size components. The various component feed means coexist side by side, each ending at a component feed location 11. Some twenty feed locations 11 can each receive components, which are pre-positioned by known means so that they are presented at location 11 in an approximately predetermined position which may still be rectified during transfer by head 6. This head comprises a lowerable transfer tube 12, the tip of which is formed by a nozzle 13. When head 6 has been properly positioned and transfer tube 12 is lowered, so that nozzle 13 arrives at a feed location 11, a vacuum is applied through transfer tube 12 and nozzle 13, whereby the component is picked up by transfer tube 12. The various control means, suction means, motors, or pneumatic controls, are not shown. Tube 12 with nozzle 13 is then retracted into head 6, which is moved by the sequential positioning means 3, 4, and 5 until it is over substrate 7. During this transfer, the component is further reoriented by rotation of transfer tube 12 in order to be correctly presented on substrate 7. Head 6 preferably comprises centering jaws which, before the orientation of the component is modified, recenter it and, if necessary, rectify its initial positioning. The rotation and recentering means are not shown in FIG. 1. When transfer tube 12 and nozzle 13 have arrived above substrate 7, they are again lowered in order to place the component. The vacuum in transfer tube 12 is then cut off (for very light components, it is even replaced sometimes by air pressure) so that the component remains in place when transfer tube 12 is again retracted.

Since FIG. 1 is intended only to illustrate the overall situation, no further details concerning this prior art arrangement need be given.

During a cycle, transfer tube 12 is lowered and raised a number of times to take various components from various respective feed locations 11, then to place them properly on substrate 7. Depending on the shapes of the components, pick-up nozzle 13 must likewise have a particular shape; hence interchangeable nozzles 13a are available on a nozzle support 14 fixed to the frame. The change of nozzles during a cycle takes place by a dipping maneuver similar to that for picking up and placing a component; nozzle support 14 comprises remote-controlled means for locking and unlocking nozzles 13a, which means operate selectively to facilitate discharge and changing of the nozzles.

FIG. 2 is a perspective view of the lower part of placer head 6, with transfer tube 12 and nozzle 13, in retracted position, i.e., when not lowered. This drawing figure illustrates the case where four centering jaws 15 are provided around transfer tube 12 and nozzle 13. Jaws 15 are normally open as shown in FIG. 2. When transfer tube 12 has picked up a component and is transferring it, the four jaws 15 close like fingers, in pairs, i.e., two diametrically opposed jaws always move jointly so that these two jaws would tend to meet in the center. The closing of the pairs of jaws is elastic, but the coupling within a pair of jaws is rigid. This makes it possible to recenter cylindrical, square, rectangular, etc., components. For lowering to place a component, jaws 15 are naturally reopened.

FIGS. 1 and 2 situate the invention without yet showing its specific particularities. FIGS. 3 (3a, 3b) shows a head 20 for the automatic placing of a component, designed in accordance with the invention Note that in FIG. 3b, most of the movable parts and control parts, except for those responsible for the elasticity of lowering the transfer tube, have been omitted.

Placer head 20 is disposed in a body 21 which has the approximate outer shape of a parallelepiped and is mounted during use on, in, or against block 5 of FIG. 1, subject to the different sequential positioning movements.

A number of frame or assembly parts are fixed directly or indirectly to head body 21. The shapes of these uprights or assembly parts will be clearly understood if FIGS. 3a and 3b are considered jointly. Thus, supports 22, 22a, and 23 are used for mounting the pivot points of levers to be considered below. Furthermore, assembly elements 24-29 are used for mounting a motor and related parts for controlling the pressure of a release spring 68, also considered below. Parts 31 and 32 are used for mounting the assembly of a motor 36, a reduction gear 37, and a tachographic revolution counter 38, used for rotating head 20 via a grooved belt 39 acting upon a suitable pulley 40. Fixed parts 30 are used for mounting a jaw-controlling electric motor 41.

An axially non-displaceable rotary portion 33 of head 20, shown in FIG. 3a, is rotatingly mounted in body 21 and bears pulley 40, driven in order to modify the orientation of the component, as will be explained below. A transfer tube 34, shown in FIG. 3a without the nozzle it bears in operation, is mounted axially slidingly within rotary portion 33. Disposed around tube 34 are centering jaws 35, to be described in more detail with reference to FIGS. 5 and 6.

A sliding tubular part 48 enters rotary portion 33 from above, i.e., through the flange of pulley 40; it comprises, within portion 33, cam and spring means for opening jaws 35. For controlling jaws 35, part 48 must move axially, and for that purpose it bears a grooved wheel 47 driven by the end 46 of a driving lever 44. Transfer tube 34, the top portion of which is indicated by reference numeral 34a, in turn passes through tubular part 48. In order to carry out its dipping movements (of an amplitude of approximately 20 mm), tube 34 bears at its top 34a a grooved wheel 57 actuated by the end 56 of a driving lever 54. Tube 34 with wheel 57 does not rotate relative to tubular part 48 with wheel 47, nor does the latter itself rotate relative to rotary head portion 33. When belt 39 drives pulley 40, all three of these units rotate together as an integral assembly, their relative movements being only axial.

Before dipping of tube 34, unit 47, 48 must move to open jaws 35, then tube 34 is lowered. When it has reached its lowest point, suction means (not shown) create a vacuum within tube 34 so that its nozzle (not shown in FIG. 3) picks up a component. Tube 34 is then raised into its retracted position, and only then do jaws 35 go into action in that tubular unit 47, 48 also rises, jaws 35 then acting in diametrically opposed pairs under the influence of their own springs (not shown).

The two axial movements of tube 34 with wheel 57 and of tubular part 48 with wheel 47 are controlled, respectively, via levers 54 and 44 actuated by electric motors 51 and 41 via connecting rods 52 and 42 and joints 53 and 43. FIG. 3a shows in dot-dash lines as 53a and 54a the joints in the other end position of rods 52 and 42, the two positions of the rods being arrested, by a catch effect, on motors 41 and 51. FIG. 3a shows four blocks C41B, C41H, C51B, and C51H on motors 41 and 51. These parts are both mechanical and electric and perform the dual function of stopping the rotor of the motor in the end positions of rods 52 and 42 and of supplying an electric monitoring signal of completed movement (half a revolution) of the rotor.

Jaw-opening control lever 44, controlled by motor 41, pivots at the location of a fixed pivot pin 45. Tube-lowering control lever 54, controlled by motor 51, pivots in a special pivoting device 55 to be described with reference to FIG. 4. It will be noted to start with that control of the rotary parts, and of the lowerable transfer tube in particular, by an electric motor and linkage arrangement, already brings about a significant improvement concerning the harmful effect of inertia, as compared with pneumatic control. The movement of such a control by means of a motor making half a revolution and actuating a rod in fact corresponds more or less to a sinusoidal motion, thus free of abrupt acceleration at the beginning of the stroke and of abrupt deceleration at the end of the stroke.

The arrangement of pivot 55, integral with tube-dipping control lever 54, co-operating with release disks 60, provides the suction-tube control with very special characteristics which will now be described, also with reference to FIG. 4 (4a, 4b, 4c).

When motor 51 makes half a revolution, bringing the end of rod 52 from C51B to C51H, joint 53 obviously makes a compulsory movement; the mechanical torque of the motor is assumed to be such that rod 52 cannot be held back. As long as pivot 55 is forced to remain on the same axis, the movement of end 56 of lever 54 will obviously also be compulsory, and the corresponding downward movement of tube 34 will likewise be compulsory.

However, pivot 55 has, at each end about which pivoting takes place in fixed disks 60, a portion of crescent-shaped cross-section 71, the shape of which results from a notch 72 made in the cylindrical surface 73 of the pivot. Each of the two fixed disks 60, on the other hand, includes an angled aperture or slot 61 over a certain sector, as is clearly visible in FIG. 4b. As long as portions 71 of pivot 55 occupy the position hatched in FIG. 4b, the pivot is held in disks 60. However, when lever 54, and with it pivot 55, rotates in the direction which controls lowering of the transfer tube, portions 71 likewise rotate and assume the position shown in dot-dash lines as 71A in FIG. 4b. From then on, pivot 55 is released to move at right angles to its axis, and in particular to assume the position shown in dot-dash lines as 71B. This means that once the ridges of pivot 55 have slid past the angles 61a of slots 61 (cf.71A), the raising of joint 53 does not necessarily result in the lowering of end 56 of lever 54 but may equally well result in an upward movement of pivot 55. The lateral positionings are not critical.

Returning to FIG. 3b, it will be seen that the bottom of a pressure rod 65 is pressed against the middle outer surface 76 of pivot 55, so that the latter tends to remain as far down as possible in slots 61 of disks 60. A washer or a pin 69 arrests the bottom of spring 68 relative to rod 65, the top of spring 68 being held by washers 66. Rod 65 thus exerts a force which counters the release of pivot 55, this force emanating from spring 68 and being adjustable by the positions of washers 66 on rod 65.

The particular arrangement 55, 60 is designed in such a way that the major part of the lowering stroke of tube 34, 34a with grooved wheel 57 takes place compulsorily and that the possibility of elastic release, against the bias of spring 68, exists only close to the end of the stroke. This presents the advantage of having a non-elastic tube-lowering movement over almost its entire length, i.e., not undergoing the harmful effects of the masses of inertia, while nonetheless having a certain elasticity at the moment when the tube places, or is about to place, the component on the substrate.

It should be noted that this two-phase lowering—the first phase compulsory (or non-elastic) and the second with a possibility of elastic release—is a main particularity of the proposed concept. Furthermore, its embodiment in the arrangement 55, 60 is advantageous but does not exclude the use of other means (e.g., cam means) for producing the main subject-matter of the invention.

If the substrate (such as substrate 7 in FIG. 1) had a certain elasticity, and if the component came up against the substrate before the release could occur, then the substrate would yield resiliently, and when the critical point had been exceeded, would push the component and the transfer tube back up, causing pivot 55 to jump from position 71A to position 71B. Next, upon rising of tube 34, the reverse movements ought to take place. Experience has shown, however, that the inclination of the wall 74 (FIG. 4b) of slot 61 in disk 60 plays an important part. In a test model where wall 74 was substantially radial, pivot 55 in position 1B butted up against this wall, and nothing returned it to position 71A. Interferences then occurred which damaged the device. However, it was found that by giving wall 74 a certain inclination relative to the radial, the aforementioned drawback was eliminated.

FIGS. 3a, 3b, 4a, 4b, and 4c allow a clear understanding of how this mechanism is constructed. Each disk 60 will be seen to include a cylindrical part 77 so that it can be accommodated more suitably in frame part 23, which comprises a cirular center opening continuing into a countersink 79. It will be seen that slots 61 of disks 60 pass through cylindrical part 77 but do not extend to the outside edge of the disk, thus ensuring the firm hold and mechanical rigidity of disks 60.

Each disk 60 includes two holes 78 for securing it to frame part 23 and a flat 60a as an aid to positioning during assembly.

Turning once more to FIGS. 3a and 3b, the means for controlling the force of spring 68 will be considered. Rod 65 is threaded, at least at the top. An electric motor 62 drives a large-diameter pinion 63 meshing with a pinion 64 which has a central internal thread and turns screwingly on rod 65. As the gearing of pinion 63 is relatively long, the axial movement of pinion 64 does not hinder its control. When motor 62 runs one way, pinion 64 screws itself downward on rod 65, thus compressing spring 68. When motor 62 runs the other way, the opposite takes place, and the bias of spring 68 decreases.

It should be noted that in one standard embodiment, motor 62 may be omitted and replaced by means for operating pinion 64 manually.

Pinion 64 acts against spring 68 via two stay-bolts 66 between which an indicator plate 67 is disposed. This plate has a finger-like portion, the end of which is guided in a vertical slot 70 in frame part 26. As is shown in dot-dash lines in FIG. 3, presence or position detectors C1, C2, and C3 may easily be mounted against frame part 29, which preferably includes vertical slots for that purpose. As the whole machine is controlled by a computerized electronic control unit, the signals from detectors C1, C2, and C3 may selectively control the duration and polarity of the current supplied to motor 62, so that it is very simple to obtain rapid modification of the force of elastic release of the end of lowering of the transfer tube. Tests have shown that three degrees of force may easily be provided for: one on the order of a few grams, another on the order of some 20 g, and the highest on the order of approximately 80 g.

Most of the time, it is when the machine, during its cycle, must go from placing small components to placing large components that the elastic-release force must be modified. At that point in the cycle, it is most often necessary to change nozzles (as in the prior art machines), and it may also be necessary to mount span extenders for the centering jaws, as well be seen below. During the cycle, therefore, there is a slightly increased interval between the placing of two successive components, and the selection of a different degree of force by the abovementioned means is achieved without loss of time.

With reference to FIG. 1, mention has been made of nozzle changes which are often carried out during the placement cycle. With the arrangement for control of the suction-tube lowering in two-phases—one compulsory and the other resiliently releasable, according to the proposed concept, there is an appreciable section of the stroke where the question of resistance does not arise. To fit a new nozzle, block 5 (FIG. 1) is used to place the head prior to lowering in a starting position in which the transfer tube is completely engaged in the nozzle (see FIG. 5) before reaching or, at the latest, upon reaching the elasticity-switching point (FIG. 4b). Hence the elasticity enjoyed at the end of lowering for placing the components on the substrate will not interfere with changing the nozzle. Nozzle support 14 (FIG. 1) comprises means for locking and unlocking the nozzles: in principle, when the nozzles are locked, raising of the transfer tube leaves the nozzle on the support, whereas when the nozzles are unlocked, the nozzle goes along with the tube when it is raised. It will be easily understood how the nozzle can be changed in two successive dips by making use of the locking and unlocking means in support 14.

FIG. 5, a partially sectional view of a nozzle 81 and two jaws 80 at the bottom of tube 34, shows how this nozzle is fitted in the tube. Nozzle 81 comprises a collar 85 which rests against the bottom of tube 34 and naturally includes a center bore 82 for applying the suction; it further comprises a conical portion 83 at the top of the cylindrical body for facilitating its engagement in tube 34. A little farther down is a groove 84 intended to receive an O-ring (not shown) for holding the nozzle firmly in the transfer tube.

It will be seen in FIG. 5 that centering jaws 80 are not of exactly the same shape as jaws 35 in FIG. 3a but have two levels. With a relatively short nozzle, such as nozzle 81, they are suitable for recentering a small component picked up by that nozzle, the recentering surfaces then being the surfaces 87 of projections 86 on the inner sides of the jaws. Surfaces 87 are used for recentering small elements up to dimensions of approximately 16 mm. For recentering larger elements, on the other hand, up to dimensions typically ranging from 12 to 28 mm, a longer nozzle reaching down to between projections 86 is fitted; in that case, it is the lower inside surfaces 88 which are used to recenter the component. When a longer nozzle is fitted, block 5 (FIG. 1) suitably fixes at a slightly higher level the starting position for lowering of the transfer tube so that the tip of the nozzle reaches precisely the desired level, i.e., the level of the feed location or of the substrate, to which is added the thickness of the component.

The arrangement comprising solely centering jaws 80 allows the recentering of components up to about 28 mm. As suggested at the righthand side of FIG. 5, this system of steps for the centering jaws can be extended. However, this would be possible only by means of a prohibitive increase in the length of the stroke and in space requirements. For when a small element is to be picked up or put down, a small nozzle such as nozzle 81 is used; and in order to pick up or put down an element, it is necessary to be able to hold it beyond the lowest extremity of the jaws, otherwise that extremity will come in conflict with the feed location or the substrate. For instance, if the device at the right-hand side of FIG. 5 were produced in one piece, about 15 mm of the stroke would be wasted, and the total stroke would have to be increased by about 10 mm.

To avoid this drawback, the span of the centering jaws is enlarged with the aid of extension pieces 89 in this embodiment of the invention. These extension pieces have the general shape of a Z, one longer arm 91 of which is placed behind jaw 80. Span-extending piece 89 thus provides centering surfaces 90 and 98 situated farther away from the center. With surface 90, components in the range of approximately 23 to 39 mm can be recentered, and with surface 98, components from about 35 to 52 mm.

Mounting, securing, and removal of extension pieces 89 takes place automatically during the cycle. The extension piece is placed on a suitable support, preferably aligned with the feed locations, resting on its bottom surface 97 and with its lower arm 92 fitted in an appropriate hollow in the support. The locking and unlocking means of this support (not shown) may, for example, act upon the upwardly facing surface 99. In principle, the extension pieces are attached and detached in the same way as the nozzles; however, in the case of the extension pieces, the transfer tube remains retracted, and it is vertical-positioning means 5 (FIG. 1) which operates.

As is apparent from FIG. 6, arm 91 of extension piece 89 is not as wide as the other portions and corresponds approximately to jaw 80 in width. Just behind a vertical notch 100 in arm 91 there is a spring clip 95 fixed on surface 99 of extension piece 98 and having a form of snap means 96. Jaw 80, on the other hand, comprises at the back a cylindrical stud 93 and a mushroom-shaped stud 94. It will be readily understood that at the time of mounting and attachment, studs 93 and 94 enter vertical notch 100, stud 93 also entering spring clip 95 and being stopped in snap means 96, while the head of stud 94 slides between arm 91 and clip 95, suitably holding arm 91 flat against jaw 80. For removing the extension pieces, the locking means (not shown) are retracted, the head with the jaws and the extension pieces is lowered until the extension piece is on its support, then the locking means start to act against surface 99, and the jaws are raised, leaving the locked extension pieces behind. For the automatic pick-up (mounting and attachment) of one or two pairs of extension pieces, the same operations are carried out in reverse.

The right-hand part of FIG. 5 shows in broken lines an extension piece 89 attached to the back of a jaw 80. It will be understood that there will, in fact, be either one or two pairs of extension pieces, the operating principle of the jaws remaining the same. Fundamentally, all centering takes place at the same level. With rectangular components, for instance, two pairs of extension pieces might be provided, one pair having its surfaces 98 much closer to the center than the other pair. The machine can thus operate, selectively and with automatic changeover possible during the cycle, without extension pieces, with a first set of extension pieces, or with a second set of extension pieces, etc. The nozzle selected must correspond to the level at which it is desired to have the centering jaws and/or extension pieces operate.

When extension pieces are changed, the transfer tube is obviously in retracted position, and the jaw control is in open position, i.e., the end of rod 52 occupies position 53 shown in FIG. 3a, while the end of rod 42 occupies the displaced position 43a shown in dot-dash lines in FIG. 3a. In that situation, jaws 80 extend vertically, i.e., parallel to the axis of the head and of the transfer tube, thus allowing the extension pieces to be fitted as described above.

The complete embodiment, comprising the automatic change of release force arrangement 63–39, the nozzle-changing device, and the extension piece attachment and removal device illustrated in FIGS. 5 and 6, all these functions taking place automatically and during the cycle, provides a highly advanced apparatus by means of which components of any size and kind can be placed. Simpler embodiments may naturally also be envisaged, e.g., where the force is regulated manually rather than automatically, as well as embodiments without pieces for extending the span of the centering jaws, etc.

In one embodiment of the machine, which can be produced as an option, the centering jaws of the placing head are electrically insulated from the rest of the machine and may thus be used for measuring electric values (electric parameters) of the component or for checking electric particularities thereof.

What is claimed is:

1. An automatic machine for placing components of various shapes on substrates, comprising:
   at least one component feed location,
   substrate-supporting means,
   at least one placer head for translatory movements within a space extending above said component feed locations and said substrate-supporting means, and
   head translation control and driving means for successively positioning said head above and facing each of said feed locations and supporting means, said head comprising:
   a lowerable transfer tube having a free lower end substantially directed toward said feed locations and supporting means,
   a controlled component-pickup tip arranged at said free lower end, and
   dipping control means for driving and operating said transfer tube and said pickup tip for dipping movements, to withdraw a said component from a said feed location and to put this said component on a substrate disposed on said supporting means,
   wherein said dipping control means comprise:
   dipping driving means provided with an element selectively driven for effecting reciprocations and transmission means arranged for a partly compulsory and partly elastically retainable transmission of said reciprocation of said element to said transfer tube, said transmission means comprising:
   a transmission mode selecting device responsive to said reciprocation for determining (and deciding) a compulsory transmission mode and an elastically retainable transmission mode of said transmission means, and thereby defining said dipping in a first phase, of compulsory lowering of said transfer tube, and in a second phase, of elastically conditioned lowering of said transfer tube, said second phase taking place at the lower end-of-course of said dipping movements of said transfer tube and pickup tip, and releasing force determining means for establishing and calibrating an elastic release force for said second phase of dipping.

2. The machine of claim 1, wherein said transmission means comprise a three-point lever pivoting on an axis constituting one of said three points, another point being connected to the reciprocated element, and the last point being kinematically connected to an element for axial movement of said transfer tube, said transmission mode selecting device being disposed on the axis of said lever and comprising a pivot having a notched cross-section configuration with a notch extending over less than 180°, accommodated in a bearing which is open or greatly widened, on a certain sector (FIGS. 4a and 4b), in such a way that depending upon the relative angular position of said pivot and of said bearing, which position is modified when said lever pivots, said pivot is compulsorily centered in said bearing or is released for movement perpendicular to its axis, so that the release thus allowed to the first point of said lever renders the transmission from the second point to the third point noncompulsory, whereas the compulsory centered maintenance of said pivot in said bearing renders said transmission compulsory.

3. The machine of claim 2, wherein said pivot is mounted fixed in said lever and includes a middle portion of round cross-section, said notched cross-section being disposed at the ends of said pivot which are respectively fitted in two said bearings, open or widened on a certain sector, which are aligned axially in two fixed walls, between which said lever pivots, said releasing force determining means comprising spring means acting against said middle portion of said pivot in a direction which tends to keep said pivot coaxial with said bearings, the spring effect of said spring means furnishing said release force.

4. The machine of claim 2, wherein said open bearing includes in its open portion allowing said release an oblique flank which compulsorily returns said pivot to a centered position coaxial with said bearing when said lever pivots back to move said transfer tube back from dipping.

5. The machine of claim 3, wherein said open bearing includes in its open portion allowing said release an oblique flank which compulsorily returns said pivot to a centered position coaxial with said bearing when said lever pivots back to move said transfer tube back from dipping.

6. The machine of claim 1, wherein said transmission mode selecting device is arranged or designed to establish said first phase at the beginning of said dipping and over the major part of the latter and to establish said second phase in the vicinity of the end of said dipping.

7. The machine of claim 1 intended to place components of different sizes in the same cycle, wherein said component pickup tip of said transfer tube is a suction tip formed of a removable nozzle, a set of different nozzles being available on a selectively locking support of the machine, and wherein said head and said head translation control and driving means are arranged to carry out a change of nozzle by dipping of said transfer tube, said head translation control and driving means being arranged to place said head, before dipping of said transfer tube, above said nozzle support at a distance such that said transfer tube reaches during said first phase a lowered position in which said transfer tube is fitted to said nozzle whereas said nozzle is fitted in said support.

8. The machine of claim 1, wherein said dipping driving means comprise an electric dipping motor actuating a reciprocating connecting rod, which forms said element effecting said reciprocations, a snap effect device being provided for arresting said motor in two angular positions which position said rod at the two respective ends of said reciprocations.

9. The machine of claim 1, further comprising jaws for centering the component held by said transfer tube, which jaws are arranged for acting when said transfer tube is retracted outside of dipping, wherein said head comprises an axial sliding part for controlling said jaws, said part being in turn controlled from an electric jaw-controlling motor causing reciprocation of a connecting rod, a snap effect device being provided for arresting said motor in two angular positions which position said rod at the two respective ends of said reciprocation.

10. The machine of claim 8, further comprising jaws for centering the component held by said transfer tube, which jaws are arranged for acting when said transfer tube is retracted outside of dipping, wherein said head comprises an axial sliding part for controlling said jaws, said part being in turn controlled from an electric jaw-controlling motor causing reciprocation of a connecting rod, a snap effect device being provided for arresting said motor in two angular positions which position said rod at the two respective ends of said reciprocation.

11. The machine of claim 1, further comprising jaws for centering the component held by said transfer tube, which jaws are arranged for acting when said transfer tube is retracted outside of dipping so as to rectify the initial orientation of said component before said head is controlled rotatingly in order to give said component the proper orientation for placement on said substrate, various components, some of them large-sized, having to be picked up successively at different said feed locations during the same cycle to be placed on the same substrate, comprising a jaw-span extension-piece support and jaw-span extension pieces, said jaw-span extension pieces being stored on said machine at a selectively locking jaw-extension piece location, said jaws and said jaw-extension pieces being formed to allow selectively, during a cycle, the addition and the removal of a span-extension piece on each said jaw, respectively, by the action of said head translation control and driving means at a time when said transfer tube is retracted, outside dipping.

12. The machine of claim 11, wherein said span-extension pieces are substantially Z-shaped and are attachable against the backs of the jaws so that one arm of the Z projects farther than the jaws and forms a centering shoulder for the larger-size components, the attachment of the extension pieces to the backs of the jaws being by means of slide studs, with at least one resilient stop device.

13. The machine of claim 1, wherein said releasing force determining means comprise means for adjusting said elastic release force they set up in opposition to said release.

14. The machine of claim 13 intended for the placement, during a cycle, on the same substrate, of components having different sizes and make-up, taken from different locations, wherein said means for adjusting comprise a member for controlling increases and decreases of said elastic release force, said member being designed to change said force automatically during a cycle.

15. The machine of claim 14, wherein said member for controlling comprises an electric motor, a linear actuator controlled by said motor, a spring-loading part which is selectively displaced with said actuator, and a spring having one end compressed by said spring-loading part, the other end of said spring supplying said force acting in opposition to the release.

16. The machine of claim 15, further comprising means for preadjusting different degrees of said force by preadjustment of different linear positions of said spring-loading part, and detectors disposed for detecting the attainment of said different linear positions and stopping said electric motor thereupon.

17. The machine of claim 1, wherein said transfer tube is capable of pickup by vacuum and suction of air, a plurality of said component-feed locations being provided for components of various sizes brought by various delivery means including vibratory sticks, tapes of components, or magazines, said head translation control and driving means being arranged to adapt the vertical positioning of said head to the thickness of the respective component to be picked up and placed.

18. A placer head for a machine for placing components of various shapes on substrates used in the manufacture of electronic circuits, said components being presented in at least one feed location of the machine, the substrate being presented on supporting means of the machine, said head comprising:
a lowerable suction tube capable of dipping movement toward feed locations and supporting means,
dipping control means for driving and operating said suction tube for dipping movements, to withdraw a said component from a feed location and to place said component on said substrate,
said dipping control means comprising:
dipping driving means provided with an element driven for effecting reciprocations and
transmission means arranged for a partly compulsory and partly elastically retainable transmission of said reciprocations of said element to said suction tube
said transmission means comprising:
a transmission mode selecting device responsive to said reciprocation for determining (and deciding) a compulsory transmission mode and an elastically retainable transmission mode of said transmission means, and thereby defining said dipping in a first phase, of compulsory lowering of said transfer tube, and in a second phase, of elastically conditioned lowering of said transfer tube, said second phase taking place at the lower end-of-course of said dipping movements of said transfer tube and pickup tip, and
releasing force determining means for establishing and calibrating an elastic release force for said second phase of dipping.

19. The placer head of cliam 18, wherein said transmission means comprise a three-point lever pivoting on an axis constituting one of said three points, another point being connected to the reciprocated element, and the last point being kinematically connected to an element for axial movement of said transfer tube, said device responsive to said reciprocation being disposed on the axis of said lever and comprising a pivot having a notched cross-section configuration with a notch extending over less than 180°, accommodated in a bearing which is open or greatly widened, on a certain sector (FIGS. 4a and 4b), in such a way that depending upon the relative angular position of said pivot and of said bearing, which position is modified when said lever pivots, said pivot is compulsorily centered in said bearing or is released for movement perpendicular to its axis, so that the release thus allowed to the first point of said lever renders the transmission from the second point to the third point non-compulsory, whereas the compulsory centered maintenance of said pivot in said bearing renders said transmission compulsory.

20. The placer head of claim 19, wherein said pivot is mounted fixed in said lever and includes a middle portion of round cross-section, said notched cross-section being disposed at the ends of said pivot which are respectively fitted in two said bearings, open or widened on a certain sector, which are aligned axially in two fixed walls, between which said lever pivots, said releasing force determining means comprising spring means acting against said middle portion of said pivot in a direction which tends to keep said pivot coaxial with said bearings, the spring effect of said spring means furnishing said release force, and wherein said open bearing includes in its open portion allowing said release an oblique flank which compulsorily returns said pivot to a centered position coaxial with said bearing when said lever pivots back to move said transfer tube back from dipping.

21. The placer head of claim 18, wherein said releasing force determining means comprise means for adjusting said elastic release force which acts in opposition to said release, said means for adjusting comprising an element for controlling increases and decreases of said elastic release force, said element being arranged for changing said force automatically.

22. The placer head of claim 21, wherein said element for controlling comprises an electric motor, a linear actuator controlled by said electric motor, a spring-loading part which is selectively displaced with said actuator, and a spring having one end compressed by said spring-loading part, the other end of said spring furnishing said force conditioning said elastic release, and wherein means are further provided for preadjusting different degrees of said force by preselection of different linear positions of said spring-loading part, detector means being disposable for automatic re-attainment of said positions.

* * * * *